United States Patent
Ding et al.

(10) Patent No.: US 6,187,506 B1
(45) Date of Patent: Feb. 13, 2001

(54) ANTIREFLECTIVE COATING FOR PHOTORESIST COMPOSITIONS

(75) Inventors: Shuji Ding, Branchburg; Dinesh N. Khanna, Flemington; Mark A. Spak, Edison; Dana L. Durham, Flemington; Jianhui Shan, High Bridge; Eleazer Gonzalez, Bloomfield, all of NJ (US)

(73) Assignee: Clariant Finance (BVI) Limited (VG)

( * ) Notice: Under 35 U.S.C. 154(b), the term of this patent shall be extended for 0 days.

(21) Appl. No.: 09/368,740

(22) Filed: Aug. 5, 1999

(51) Int. Cl.[7] ................. G03C 5/00; C03F 8/30
(52) U.S. Cl. ............... 430/271.1; 430/270.1; 430/325; 430/330; 430/327; 525/326; 524/555; 526/312
(58) Field of Search ............ 430/270.1, 271.1, 430/325, 330, 327, 950; 525/326; 524/555; 526/312

(56) References Cited

U.S. PATENT DOCUMENTS

| | | |
|---|---|---|
| 4,491,628 | 1/1985 | Ito et al. . |
| 5,069,997 | 12/1991 | Schwaem . |
| 5,350,660 | 9/1994 | Urano et al. . |
| 5,525,457 | 6/1996 | Nemoto et al. . |
| 5,652,297 * | 7/1997 | McCulloch et al. .......... 524/555 |
| 5,652,317 * | 7/1997 | McCulloch et al. .......... 526/312 |
| 5,693,691 * | 12/1997 | Flaim et al. .............. 523/436 |
| 5,733,714 * | 3/1998 | McCulloch et al. .......... 430/325 |

FOREIGN PATENT DOCUMENTS

WO 98/14832 * 4/1998 (WO) .

* cited by examiner

Primary Examiner—John S. Chu
Assistant Examiner—Yvette M. Clarke
(74) Attorney, Agent, or Firm—Sangya Jain

(57) ABSTRACT

The present invention relates to a novel antireflective coating solution and a process for its use in photolithography. The antireflective coating solution comprises a novel polymer and an organic solvent or mixture of solvents, where the novel polymer comprises a unit containing a dye that absorbs from about 180 nm to about 450 nm and does not contain a crosslinking group.

28 Claims, No Drawings

ANTIREFLECTIVE COATING FOR PHOTORESIST COMPOSITIONS

BACKGROUND OF THE INVENTION

The present invention relates to novel antireflective coating compositions and their use in forming a thin layer between a reflective substrate and a photosensitive coating. Such compositions are especially useful in the fabrication of semiconductor devices by photolithographic techniques. Furthermore, the novel polymer may be used as an absorbing polymer in photoresist formulations.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has led to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S=4(R_1R_2)^{1/2}e^{-\alpha D}$$

where, $R_1$ is the reflectivity at the resist/air or resist/top coat interface, $R_2$ is the reflectivity at the resist/substrate interface, $\alpha$ the resist optical absorption coefficient, and D is the film thickness.

Antireflective coatings function by absorbing the radiation used for exposing the photoresist, that is, reducing $R_2$, and thereby reducing the swing ratio. Reflective notching becomes severe as the photoresist is patterned over substrates containing topographical features, which scatter light through the photoresist film, leading to linewidth variations, and in the extreme case, forming regions with complete resist loss.

In the past dyed photoresists have been utilized to solve these reflectivity problems. However, it is generally known that dyed resists only reduce reflectivity from the substrate but do not totally eliminate it. In addition, dyed resists may cause reduction in the lithographic performance of the photoresist, together with possible sublimation of the dye and incompatibility of the dye in resist films. In cases where further reduction or elimination of the swing ratio is required, an antireflective coating is applied to the substrate prior to coating with the photoresist and prior to exposure. The resist is exposed imagewise and developed. The antireflective coating in the exposed area is then etched, typically in an oxygen based plasma, and the resist pattern is thus transferred to the substrate. The etch rate of the antireflective film should be relatively high so that the antireflective film is etched without excessive loss of the resist film during the etch process.

Antireflective coatings containing a dye for absorption of the light and an organic polymer to give coating properties are known. However, the possibility of sublimation and diffusion of the dye into the photoresist layer during the heating process can make these types of antireflective compositions undesirable.

Polymeric organic antireflective coatings are known in the art as described in EP 583,205 and U.S. Par. No. 5,525,457 and incorporated herein by reference. However, these antireflective films are cast from organic solvents, such as cyclohexanone and cyclopentanone. The potential hazards of working with organic solvents, have led to the development of the antireflective coating composition of the instant invention, where the solid components of the antireflective coating are both soluble and spin castable from solvents having lesser toxicity hazards. The preferred solvents that are known in the semiconductor industry to have low toxicity among others are propylene gycol monomethyl etheracetate (PGMEA), propylene gycol monomethylether (PGME), and ethyl lactate.

In another embodiment, by the judicious choice of electrophilic substituents and comonomers, the polymer of the present invention is castable from water. Water based coatings are not only preferred but also provide a distinct advantage in the semiconductor industry due to their ease of handling.

The polymeric coatings disclosed in U.S. Pat. No. 5,652,297 and U.S. Pat. No. 5,652,317 are soluble in the preferred solvents but contain a different pendant chromophore than the present invention. The chromophore disclosed in U.S. Pat. No. 5,733,714 is similar to the present invention but the comonomer in U.S. Pat. No. 5,733,714 contains a crosslinking group. It has now been unexpectedly found that both a homopolymer containing a similar pendant chromophore to the one disclosed in US714, and also a copolymer synthesized from a monomer containing the same pendant chromophore and a comonomer without a crosslinking group, also functions effectively as a bottom coat for the photoresist or as an additive in a photoresist. It has been found that in some instances it is preferable to have a polymer that does not contain a comonomer with a crosslinking group, since this crosslinking group could lead to instability or insolubility of the solution or the coating.

The polymer of the present invention contains a specific dye functionality, and, furthermore, the polymer may be a homopolymer or copolymerized with specific types of monomers that do not contain a crosslinking group. Good coatings are formed with the antireflective coating of the instant invention and, additionally, no intermixing is present between the antireflective coating and the photoresist film. The coating formed from this polymer also has good dry etching properties when used as a bottom coat for a photoresist, which enables a good image transfer from the resist to the substrate and good absorption characteristics to prevent reflective notching and linewidth variations.

SUMMARY

The present invention relates to a novel antireflective coating composition and processes for its use in photolithography. The polymer of the antireflective coating composition comprises at least one unit with a dye and no crosslinking groups. The dye functionality is one that strongly absorbs radiation ranging from about 180 nm (nanometer) to about 450 nm. The antireflective coating composition comprises a solvent and a polymer of the following structure:

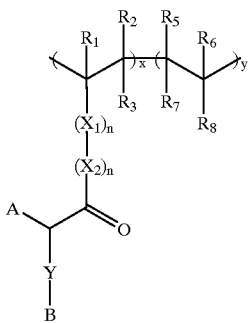

where, $R_1$–$R_3$ are independently H, ($C_1$–$C_{10}$) alkyl or ($C_1$–$C_{10}$) alkoxy, $R_5$–$R_8$ do not have a crosslinking group and are independently H, ($C_1$–$C_{10}$) alkyl, ($C_1$–$C_{10}$) alkoxy, hydroxyalkyl, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, hydroxy ($C_1$–$C_{10}$) alkyl, ($C_1$–$C_{10}$) alkylOCOCH$_2$COCH$_3$, or $R_7$ and $R_8$ combine to form a cyclic group, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n is independently 0–2, A is an electronwithdrawing group, Y is a conjugated moiety e.g. N=N, CW=CW, CW=N, or N=CW, where W is H, ($C_1$–$C_{10}$) alkyl or ($C_1$–$C_{10}$) alkoxy, x>0, and y≧0, and B is selected from a 5–10 membered aromatic group, polyaromatic group or a heterocyclic aromatic group.

Preferably the polymer has the following structure,

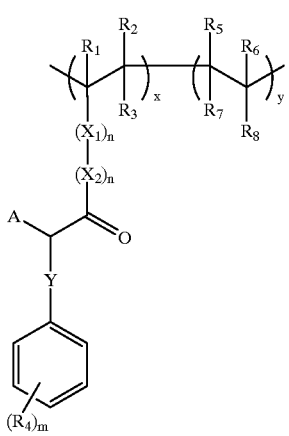

where, $R_1$–$R_3$ are independently H, ($C_1$–$C_{10}$) alkyl or ($C_1$–$C_{10}$) alkoxy, $R_5$–$R_8$ do not have a crosslinking group and are independently H, ($C_1$–$C_{10}$) alkyl, ($C_1$–$C_{10}$) alkoxy, hydroxyalkyl, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, hydroxy ($C_1$–$C_{10}$) alkyl, ($C_1$–$C_{10}$) alkylOCOCH$_2$COCH$_3$, or $R_7$ and $R_8$ combine to form a cyclic group, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n is independently 0–2, A is an electronwithdrawing group, $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, Y is a conjugated moiety N=N, CW=CW, CW=N, or N=CW, where W is H, ($C_1$–$C_{10}$) alkyl or ($C_1$–$C_{10}$) alkoxy, m=1–5, x>0, and y≧0.

The invention further comprises a process of forming an image on a substrate. The substrate is coated with the film of the antireflective coating of the instant invention and heated to remove any residual solvent and to insolubilize the coating. A film from a photoresist solution is then formed on top of the antireflective coating and further heated to substantially remove the photoresist solvent. The photoresist film is imagewise exposed through a mask with ultraviolet radiation ranging from about 180 nm to about 450 nm and processed in an aqueous alkaline developer to give a photoresist pattern. The substrate may be heated prior to and after the development step to give an image of superior quality. The exposed antireflective film can then be dry etched, usually in an oxygen plasma, with the photoresist pattern acting as an etch mask. In another embodiment of the invention, a silylating step is introduced after the development step and the prior to the etching step.

DETAILED DESCRIPTION OF THE INVENTION

The coating compositions of the present invention comprise a polymer which may be either a homopolymer obtained by reacting a monomer containing a dye of a specific structure or a copolymer where the dye monomer is reacted with a monomer which does not contain a crosslinking group, and, furthermore, where the polymer thus obtained strongly absorbs ultraviolet light having a wavelength in the range of 180 nm to about 450 nm. The present invention further provides for a process of coating and baking the antireflective coating on a substrate and applying and imaging a photoresist film on top of the antireflective coating, and followed by etching of the antireflective coating.

The polymer of the instant invention is obtained by reacting at least one vinyl monomer containing a dye functionality to form a homopolymer or with at least one other vinyl monomer that does not contain a crosslinking group to form a copolymer. The dye functionality is one that strongly absorbs radiation ranging from about 180 nm to about 450 nm. The preferred types of dyed monomeric units that can be used are defined by the following structure:

Structure 1

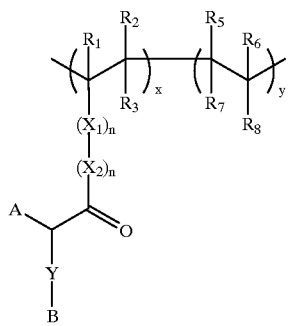

where,

R$_1$–R$_3$ are independently H, (C$_1$–C$_{10}$) alkyl or (C$_1$–C$_{10}$) alkoxy, R$_5$–R$_8$ do not have a crosslinking group and are independently H, (C$_1$–C$_{10}$) alkyl, (C$_1$–C$_{10}$) alkoxy, hydroxyalkyl, nitro, halide, cyano, aryl, alkylaryl, alkenyl, dicyanovinyl, SO$_2$CF$_3$, COOZ, SO$_3$Z, COZ, OZ, NZ$_2$, SZ, SO$_2$Z, NHCOZ, SO$_2$NZ$_2$, where Z is H or (C$_1$–C$_{10}$) alkyl, hydroxy (C$_1$–C$_{10}$) alkyl, (C$_1$–C$_{10}$) alkylOCOCH$_2$COCH$_3$, or R$_7$ and R$_8$ combine to form a cyclic group, X$_1$ is C=O, OCO, CONH, O, aryl, (C$_1$–C$_{10}$) alkyl, cyclohexyl, pyridine or pyrollidone, X$_2$ is S, S(C$_1$–C$_{10}$) alkyl, O, O(C$_1$–C$_{10}$) alkyl, NH, N(C$_1$–C$_{10}$) alkyl, alkyl, or hydroxyalkyl(C$_1$–C$_{10}$), n is independently 0–2, A is an electronwithdrawing group, Y is a conjugated moiety e.g. N=N, CW=CW, CW=N, or N=CW, where W is H, (C$_1$–C$_{10}$) alkyl or (C$_1$–C$_{10}$) alkoxy, x>0, and y≧0, and B is selected from a 5–10 membered aromatic group, polyaromatic group or a heterocyclic group.

The pendant group, B, of the chromophore is an aromatic moeity, such as a substituted or unsubstituted 5–10 aromatic hydrocarbon ring, a substituted or unsubstituted polynuclear aromatic hydrocarbon ring, such as phenyl, naphthyl or anthracyl rings, or substituted or unsubstituted heterocyclic aromatic groups, such as pyridine, indole, pyrazore, thiophene, etc.

Preferably, the polymer has the structure,

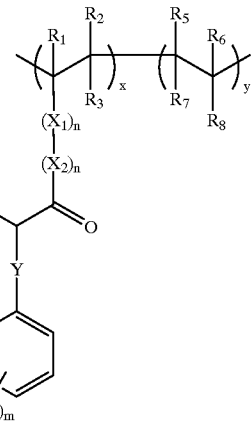

where,

R$_1$–R$_3$ are independently H, (C$_1$–C$_{10}$) alkyl or (C$_1$–C$_{10}$) alkoxy, R$_5$–R$_8$ do not have a crosslinking group and are independently H, (C$_1$–C$_{10}$) alkyl, (C$_1$–C$_{10}$) alkoxy, hydroxyalkyl, nitro, halide, cyano, aryl, alkylaryl, alkenyl, dicyanovinyl, SO$_2$CF$_3$, COOZ, SO$_3$Z, COZ, OZ, NZ$_2$, SZ, SO$_2$Z, NHCOZ, SO$_2$NZ$_2$, where Z is H or (C$_1$–C$_{10}$) alkyl, hydroxy (C$_1$–C$_{10}$) alkyl, (C$_1$–C$_{10}$) alkylOCOCH$_2$COCH$_3$, or R$_7$ and R$_8$ combine to form a cyclic group, X$_1$ is C=O, OCO, CONH, O, aryl, (C$_1$–C$_{10}$) alkyl, cyclohexyl, pyridine or pyrollidone, X$_2$ is S, S(C$_1$–C$_{10}$) alkyl, O, O(C$_1$–C$_{10}$) alkyl, NH, N(C$_1$–C$_{10}$) alkyl, alkyl, or hydroxyalkyl(C$_1$–C$_{10}$), n is independently 0–2, A is an electronwithdrawing group, R$_4$ is H, (C$_1$–C$_{10}$) alkyl, (C$_1$–C$_{10}$) alkoxy, nitro, halide, cyano, aryl, alkylaryl, alkenyl, dicyanovinyl or SO$_2$CF$_3$, COOZ, SO$_3$Z, COZ, OZ, NZ$_2$, SZ, SO$_2$Z, NHCOZ, SO$_2$NZ$_2$, where Z is H or (C$_1$–C$_{10}$) alkyl, Y is a conjugated moiety N=N, CW=CW, CW=N, or N=CW, where W is H, (C$_1$–C$_{10}$) alkyl or (C$_1$–C$_{10}$) alkoxy, m=1–5, x>0, and y≧0.

The group A, is electron withdrawing, and is preferably COR$_4$, CN or CZ. The more preferred structure for the dye unit is,

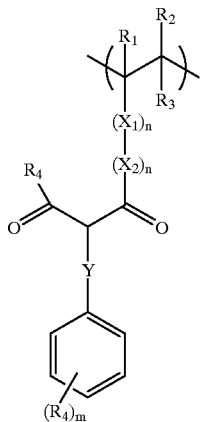

where, $R_1$–$R_3$ are independently H, ($C_1$–$C_{10}$) alkyl or ($C_1$–$C_{10}$) alkoxy, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n=0–2, $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, Y is a conjugated moiety e.g. N=N, CW=CW, CW=N, or N=CW, where W is H, ($C_1$–$C_{10}$) alkyl or ($C_1$–$C_{10}$) alkoxy, and m=1–5.

In a preferred embodiment where the polymer of the present invention is used as a bottom coat that has to be etched by a plasma, a copolymer is preferred, where the copolymer has at least one dye unit of a Structure 1 and a unit of the following Structure 2:

Structure 2

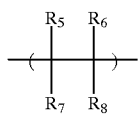

where, $R_5$–$R_8$ are not a crosslinking group and are independently H, ($C_1$–$C_{10}$) alkyl, ($C_1$–$C_{10}$) alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where, Z is H or ($C_1$–$C_{10}$) alkyl, hydroxy ($C_1$–$C_{10}$) alkyl, ($C_1$–$C_{10}$)alkylOCOCH$_2$COCH$_3$, or $R_7$ and $R_8$ combine to form a cyclic group, such as anhydride, pyridine or pyrollidone.

In another embodiment a hydrophilic monomeric unit that promotes water solubility in the copolymer is present in the polymer together with a unit containing a dye functionality, and, furthermore, where the hydrophilic monomer can be represented by the structure:

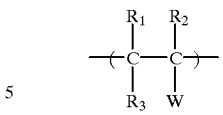

where, $R_1$ to $R_3$ are independently H, ($C_1$–$C_{10}$) alkyl, ($C_1$–$C_{10}$) alkoxy and W is a hydrophilic group.

Examples of the hydrophilic group, W, are given here but are not limited to these: $O(CH_2)_2$—O—$(CH_2)$—OH, $O(CH_2)_2$—OH, $(CH_2)_n$—OH (where n=0–4), COO($C_1$–$C_4$) alkyl, COOX and $SO_3X$ (where X is H, alkali metal, ammonium, alkyl ammonium). Other hydrophilic vinyl monomers that can also be used to form the polymer are, maleic anhydride, maleimide, vinyl pyridines, and vinyl pyrollidones.

The water soluble antireflective polymer can be synthesized by reacting any number of vinyl monomers containing at least one dye functionality described in Structure 1, any number of vinyl monomers that do not contain a crosslinking functionality (Structure 2) and/or any number of hydrophilic vinyl monomers. Mixtures of different dye monomers, different noncrosslinking monomers and different hydrophilic monomers can be polymerized to give an antireflective coating with the optimally desired lithographic and physical properties. Other unsaturated monomers can be added to the polymerization mixture that do not deteriorate the functional properties of the polymer. Examples of such unsaturated monomers are, maleic anhydride, vinyl acrylates, vinyl ethers, vinyl acrylamides, vinyl carboxylic acids, vinyl sulphonic acids and N-(3-hydroxyphenyl) methacrylamide. Alternatively, the dye can be functionalized to a copolymer to give the polymer of the current invention.

The antireflective polymer that is soluble in organic solvents can be synthesized by reacting any number of vinyl monomers containing at least one dye functionality described in Structure 1 and any number of vinyl monomers that do not contain a crosslinking functionality as described in Structure 2. Mixtures of different dye units from Structure 1 with different substituents and different units from Structure 2 can form a polymeric coating with the desired lithographic and physical properties. The substituents on each of the monomers can be chosen such that the polymer formed from these monomers is soluble in an organic solvent. Other unsaturated monomers can be added to the polymerization mixture that do not greatly effect the function of the antireflective coating. Alternatively, the dye can be functionalized to a copolymer to give the polymer of the current invention.

The process used for polymerization can be any of the ones known in the art for polymerizing vinyl polymers, such as, ionic or free radical polymerization. The polymer structure formed can be composed of alternate, block or random copolymers. The weight average molecular weight of the polymer ranges from about 500 to about 1,000,000, preferably from about 1,000 to about 100,000, and more preferably from about 3,000 to about 40,000.

The monomers can be polymerized in an organic solvent, where the solvent is the same as the casting solvent of the antireflective coating, preferably PGMEA, PGME or ethyl lactate.

The mole % of the dye containing monomer can range from about 5 to 100%, and the mole % of the non-crosslinking monomer or monomers can range from 0% to about 90% in the final polymer. Additionally, the polymer may contain unreacted precursors and/or monomers from the synthetic steps of the preparation of the polymer.

The coating composition comprises the polymer of the instant invention and a suitable solvent or mixtures of solvents. Other components may be added to enhance the performance of the coating, e.g. monomeric crosslinking agents, monomeric dyes, lower alcohols, additives to promote crosslinking, acid generators, thermally activated acid generators, acids, surface leveling agents, adhesion promoters, antifoaming agents etc. Examples of crosslinking agents include, but are not limited to, melamines, hydroxy alkyl amides, epoxy and epoxy amine resins, benzoquanamine resins, blocked isocyanates, glycolurils, dihydroxymethy benzenes, urea-formaldehyde resins and divinyl monomers. In a preferred embodiment the coating composition comprises the polymer of the instant invention, a crosslinking agent and solvent. Thermally activated acid generators and acids that can be used, but are not limited to, are 2,1,4 diazonaphthoquinone esters of multihydroxy phenolic compounds, alkyl and aryl sulfonic acids and esters, aromatic sulfonamides, alkyl and aryl phosphoric acids and esters, or thermal acid generators that are preferably activated at temperatures greater than 100° C. Monomeric dyes may also be added to the antireflective coating, examples of which are sudan orange, 2,4-dinitronaphthol, curcumin, coumarins and others.

The absorption of the antireflective coating can be optimized for a certain wavelength or range of wavelengths by the suitable choice of substituents on the dye functionality. Using substituents that are electron-withdrawing or electron donating generally shifts the absorption wavelength to longer or shorter wavelengths respectively. In addition, the solubility of the antireflective polymer in a particularily preferred solvent can be adjusted by the appropriate choice of substituents on the monomer.

The polymer of the antireflective coating composition is present in the range of about 1% to about 40% by total weight of solution. The exact weight used is dependent on the molecular weight of the polymer and the film thickness of the coating desired. Typical solvents, used as mixtures or alone, that can be used are propylene glycol monomethyl ether (PGME), propylene glycol monomethyl etheracetate (PGMEA), ethyl lactate, water, cyclopentanone, cyclohexanone, and gamma butyrolactone, but PGME, PGMEA and ethyl lactate or mixtures thereof are preferred. Solvents with a lower degree of toxicity, and good coating and solubility properties are generally preferred.

Since the antireflective film is coated on top of the substrate and is further subject to dry etching it is envisioned that the film is of sufficiently low metal ion level and purity that the properties of the semiconductor device are not adversely effected. Treatments such as passing a solution of the polymer through an ion exchange column or a combination of anion and cation exchange columns, filtration, and an extraction process can be used to reduce the concentration of metal ions and to reduce particles. Metal ion levels in the polymer below 50 ppb each metal are preferred, below 10 ppb are more preferred and below 1 ppb are even more preferred.

The antireflective coating composition is coated on the substrate using techniques well known to those skilled in the art, such as dipping, spin coating or spraying. The film thickness of the antireflective coating typically ranges from about 0.1 micron to about 1 micron. Thicker coatings, especially up to 10 microns, can also be used if necessary, especially for planarization of substrates with topography. The coating is further heated on a hot plate or convection oven to remove any residual solvent and to insolubilize the film.

Photoresists coated over the antireflective film can be any of the types used in the semiconductor industry.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the drive toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 300 nm to 440 nm.

Photoresists sensitive to short wavelengths, between about 180 nm and about 300 nm can also be used. These resists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. Pat. No. 5,350,660.

The process of the instant invention further comprises coating a substrate with the novel antireflective coating composition and heating on a hotplate or convection oven at a sufficiently high temperature for sufficient length of time to remove the coating solvent in order to insolubilize the polymer to a sufficient extent so as not to be soluble in the coating solvent of the photoresist or in the aqueous alkaline developer. Various substrates known in the art may be used, such as those that are planar, have topography or have holes. The preferred range of temperature is from about 70° C. to about 250° C., preferably from about 100° C. to about 200° C. If the temperature is below 70° C. then insufficient loss of solvent or insufficient degree of insolubilization takes place and at temperatures above 250° C. the polymer may become chemically unstable. The exact temperature to be used is determined by the specific application. A film of a photosensitive material is then coated on top of the antireflective coating and baked to substantially remove the photoresist solvent. The photoresist is imagewise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate is then be dry etched. The etching may be carried out in a suitable etch chamber to remove the exposed portions of the antireflective film, with the remaining photoresist acting as an etch mask. Optional heating steps may be included to optimize the etching process. Various etching techniques known in the art may be used.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

Another process that requires a bottom coat, such as the one of the present invention, is one where the photosensitive layer can be silylated to produce an etch resistant mask for etching the bottom coat. Such a process comprises forming a coating on a substrate with a bottom coat using the composition of the present invention, forming a photosensitive layer, imaging and developing the photosensitive layer, silylating this photosensitive layer with an appropriate silylating agent, and etching the bottom coat using the silylated photosensitive image as a mask. The concept of silylation is known to those skilled in the art and is described in the reference, Sebald et al, SPIE, Vol. 1262, pages 528–537, 1990. The photoresist to be silylated is designed, as known in the art, to be one capable of silylation. It has been found that the bottom coat of this invention is especially well-suited to this process since it has optimum etch properties.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Example 1

Preparation of Polymer 1

To a 1-liter round bottom flask was added in sequence 360 ml of methanol, 60 ml of concentrated hydrochloric acid, and 50 grams of ethyl aminobenzoate. The solution was cooled to 10° C. and 35 grams of iso-butyl nitrite was added to the flask while stirring. The diazotization reaction occurred immediately. After the addition of iso-butyl nitrite was completed, the solution was stored at 10° C. and was ready for the coupling reaction.

To a 2-liter flask was added 65.5 grams of 2-(methacryloyloxy)ethyl acetoacetate(MEEM), 65 grams of pyridine, and 1.2 liters of methanol. The solution was cooled to 10° C. and the above diazonium salt was added to the reactor. The coupling product formed immediately and precipitated out to give a suspension solution. After the addition of the diazonium salt was completed, the reactor was allowed to warm up to room temperature. The yellow solid, 4-ethyloxycarbonylphenylazo coupled product (ECP), was collected by filtration with a 90% yield.

In a 1-liter flask, 100 grams of ECP were dissolved in tetrahydrofuran(THF). The solution was degassed by vigorously bubbling nitrogen through the solution for about 1 hour. Seventeen grams of methyl methacrylate(MMA) and a solution of 2,2'-azobisisobutyronotrile(AIBN) (1.4 grams) in THF were then injected into the solution and the polymerization mixture was further degassed for 30 minutes. The outlet needle was then removed and the sealed vessel allowed to stir at 65° C. for 20 hours. This solution was then precipitated into 5 liters of 2-propanol. The polymer was collected as a yellow solid in 95% yield. The UV-Visible spectrum of the polymer in ethyl lactate showed an absorption maximum($\lambda$max) at 356 nm. Gel Permeation Chromatography spectrum showed the polymer has weight average molecular weight (Mw) of 32,769.

Example 2

Preparation of Polymer 2

To a 1-liter round bottom flask was added in sequence 360 ml of methanol, 60 ml of concentrated hydrochloric acid, and 45.5 grams of 4-aminoacetanilide. The solution was cooled to 10° C. and 35 grams of iso-butyl nitrite was added to the flask under stirring. The diazotization reaction occurred immediately. After the addition of iso-butyl nitrite was completed, the solution was stored at 10° C. in preparation for the coupling reaction.

To a 2-liter flask was added 65.5 grams of 2-(methacryloyloxy)ethyl acetoactate, 65 grams of pyridine, and 1.2 liters of methanol. The solution was cooled to 10° C. and the above diazonium salt was added to the reactor. The coupling product formed immediately and precipitated out to give a suspension solution. After the addition of diazonium salt was completed, the reactor was allowed to warm up to room temperature. The yellow 4-acetoaminophenylazo coupled product (AAP) was collected by filtration with a 90% yield.

In a 1-liter flask, 100 grams of the above MP solid were dissolved in THF. The solution was degassed by vigorously bubbling nitrogen through the solution for about 1 hour. A solution of AIBN (1.4 grams) in THF was then injected into the solution and the polymerization mixture was further degassed for 30 minutes. The outlet needle was then removed and the sealed vessel was allowed to stir at 65° C. for 20 hours. This solution was then precipitated into 5 liters of 2-propanol. The polymer was collected as a yellow solid with a 94% yield. The UV-Visible spectrum of the polymer in ethyl lactate showed $\lambda$max at 389 nm. Gel Permeation Chromatography spectrum showed the polymer has weight average molecular weight (Mw) of 13,100.

Examples 3–8

Preparation of Polymers 3–8

Table 1 shows the polymers synthesized using the synthesis procedure described in Example 1 and gives the peak absorbance ($\lambda$max) in ethyl lactate(EL) and extinction coefficients ($\epsilon$) for these polymers.

TABLE 1

| Polymer # | AAP mole % | ECP mole % | MEAA mole % | MMA (mole %) | GPC (Mw) | λmax (nm) | ε (L/g · cm) |
|---|---|---|---|---|---|---|---|
| 2 | 100 | | | | 13,100 | 389 | 59 |
| 3 | | 100 | | | 40,357 | 356 | 60 |
| 4 | 70 | | | 30 | 6,479 | 389 | 49 |
| 5 | | 75 | 25 | | 44,196 | 356 | 52 |
| 6 | | 60 | | 40 | 32,000 | 356 | 53 |
| 7 | | 34 | 66 | | 19,024 | 356 | 28 |
| 8 | | 30 | 40 | 30 | 42,092 | 356 | 31 |

Example 9

Preparation of Polymer 9

To a 1-liter round bottom flask was added in sequence 200 ml of methanol, 40 ml of concentrated hydrochloric acid, and 25 grams of ethyl aminobenzoate. The solution was cooled to 10° C. and 18 grams of iso-butyl nitrite was added to the flask under stirring. The diazotization reaction occurred immediately. After addition of iso-butyl nitrite was completed, the solution was stored at 10° C. and ready for the coupling reaction.

To a 1-liter flask was added 32.0 grams of 2-(methacryloyloxy)ethyl acetoactate, 35 grams of pyridine, and 700 ml of methanol. The solution was cooled to 10° C. and the above diazonium salt was added to the reactor. The coupling product formed immediately and precipitated out to give a suspension solution. After the addition of the diazonium salt was completed, the reactor was allowed to warm up to room temperature. The ECP solid was collected by filtration with a 92% yield.

In a 1-liter flask, 50 grams of the above yellow solid was dissolved in THF. The solution was degassed by vigorously bubbling nitrogen through the solution for about 1 hour. 27 grams of methyl methacrylate, 29.6 grams of maleic anhydride, and a solution of AIBN (2.35 grams) in THF were then injected into the solution and the polymerization mixture was further degassed for 30 minutes. The outlet needle was then removed and the sealed vessel allowed stirring at 65° C. for 20 hours. This solution was then precipitated into 5 liters of 2-propanol. The polymer was collected as a yellow solid in 96% yield. The UV-Visible spectrum of the polymer in ethyl lactate showed λmax at 356 nm. GPC spectrum showed the polymer had a Mw of 8,044.

Examples 10–14

To a solution of 4.0 grams of each of the polymers specified in Table 2 and 96.0 grams of propyleneglycol monomethyl ether acetate(PGMEA) was added 0.48 grams of CYMEL® 303 and 0.04 grams of CYCAT® 600 (both available from CYTEC Industries, Inc.). The solution was spin-coated at 3000 rpm on to a 4-inch silicon wafer and baked on a hot plate at 180° C. for 60 seconds. The coated wafers were then immersed in various resist casting solvents such as PGMEA and EL for 60 seconds and then spin-dried. The film thickness before and after immersion was measured by a NANOSPEC-AFT. The extent of interlayer mixing between the polymer and the solvent was determined by the changes of the polymer film thickness as listed in Table 2. It is clear that the solubility of the polymer of the present invention in typical photoresist casting solvents is negligible.

TABLE 2

| Example | Polymer | Solvent | $T_1$(Å) | $T_2$(Å) |
|---|---|---|---|---|
| 10 | 1 | PGMEA | 748 | 747 |
| 11 | 1 | EL | 740 | 743 |
| 12 | 3 | PGMEA | 801 | 798 |
| 13 | 4 | PGMEA | 723 | 723 |
| 14 | 5 | PGMEA | 776 | 769 | where,
T1: polymer film thickness before solvent immersion
T2: polymer film thickness after solvent immersion

Example 15

The polymer solutions formulated in Examples 10 and 12–14 were spin-coated on to 4-inch silicon wafers and baked on a hot plate at 180° C. for 60 seconds to give a thickness of about 850 Å. The wafers were then coated with AZ® 7908 photoresist (available from Clariant Corporation, 70 Meister Ave., Somerville, N.J. 08876) and baked at 90° C. for 90 seconds to give a thickness of 0.974 µm. A 4-inch wafer coated with AZ® 7908 photoresist at 0.974 µm and baked at 90° C. for 70 seconds was used as the reference. These wafers were imagewise exposed with a NIKON® 0.54 NA i-line stepper with a range of exposures. The exposed wafers were baked at 110° C. for 60 seconds and puddle developed with AZ® 300 MIF Developer (available from Clariant Corporation, 70 Meister Ave., Somerville, N.J. 08876) for 35 seconds. The resist pattern generated on these wafers were evaluated by a Hitachi S-4000 field emission scanning electron microscope. Table 3 shows the comparison of lithographic performance of AZ® 7908 photoresist with and without the bottom antireflective coatings of the present invention. The bottom polymer coatings of the present invention clearly improve the resolution and effectively eliminate standing waves caused by wafer substrate reflection, without sacrificing photosensitivity.

TABLE 3

| Bottom Coating | DTP (mj/cm$^2$) | Resolution (µm) | Standing Wave |
|---|---|---|---|
| Example 10 | 175 | 0.28 | Eliminated |
| Example 12 | 180 | 0.28 | Eliminated |
| Example 13 | 175 | 0.30 | Eliminated |
| Example 14 | 175 | 0.30 | Eliminated |
| None | 170 | 0.38 | Severe | where, DTP is dose to print

Example 16

The polymer solutions formulated in Examples 10, 13, and 14 were spin-coated on to 4-inch silicon wafers and baked on a hot plate at 180° C. for 60 seconds to give a thickness of about 850A. The wafers were then coated with AZ® 7908 photoresist (available from Clariant Corporation, 70 Meister Ave., Somerville, N.J. 08876) and baked at 90° C. for 90 seconds to give a resist thickness from 0.75 μm to 1.10 μm. These wafers were imagewise exposed with a NIKON® 0.54 NA i-line stepper, then baked at 110° C. for 60 seconds and puddle developed with AZ® 300 MIF Developer for 35 seconds. The minimum dose required to clear the film was plotted as a function of resist thickness, a sinusoidal curve thus obtained is called the swing curve. The swing ratio of a photoresist is closely related to the linewidth variation of the photoresist pattern over a highly reflective substrate or topography commonly encountered in a semiconductor device manufacturing. The lower the swing ratio, the better the linewidth control over reflective substrate or topography. The swing ratio was calculated by the equation:

Swing Ratio=(Emax−Emin)/(Emax+Emin)

where,

Emax and Emin corresponding to the dose-to-clear of a resist thickness at the maximum and minimum on a swing curve. Swing curves were generated by plotting the dose required to clear a resist film after development as a function of the resist thickness.

$$\% \text{ Swing Reduction} = \frac{\begin{pmatrix} \text{Swing Ratio on silicon} - \\ \text{Swing Ratio on polymer} \end{pmatrix}}{\text{Swing Ratio on silicon}}$$

where, Swing Ratio on silicon and Swing Ratio on polymer correspond to the swing ratio of photoresist coated on silicon wafer and on polymer bottom coating respectively.

The %Swing Reduction of AZ® 7908 photoresist over the polymer coatings of the present invention are listed in Table 4.

TABLE 4

| Bottom Coating | % Swing Reduction |
|---|---|
| None | 0 |
| Example 10 | 88 |
| Example 13 | 75 |
| Example 14 | 85 |

It is clear that the polymer coatings of the present invention can effectively reduce the swing ratios of the photoresist.

Example 17

A silicon wafer was coated with a solution of 30 weight % Polymer 8 with a Mw of about 17,000 in ethyl lactate. The silicon wafer was heated for 60 seconds at 170° C. to give a coating of 4 microns. The wafer was then coated with AZ® CP365 photoresist (available from Clariant Corporation) and baked at 110° C. for 60 seconds. The substrate was imaged using an I-line stepper with varying exposure energies ranging from 80 mJcm$^{-2}$ to 150 mJcm$^{-2}$. The latent image was developed with AZ® 300 MIF developer for 60 seconds using the stream/puddle mode. Silylation was done using a 2 weight % Tegomer solution a siloxane polymer (available from Shin-Etsu Corporation) hexanol for 2 minutes. The pattern was transferred to the substrate using reactive ion etching with oxygen and argon gases. Secondary electron microscope images showed a complete image transfer.

What is claimed is:

1. A coating composition for use in photolithography, comprising a) a polymer having a structure,

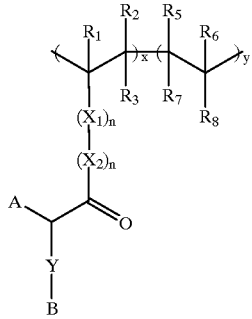

where, $R_1$–$R_3$ are independently H, ($C_1$–$C_{10}$) alkyl or ($C_1$–$C_{10}$) alkoxy, $R_5$–$R_8$ do not have a crosslinking group and are independently H, ($C_1$–$C_{10}$) alkyl, ($C_1$–$C_{10}$) alkoxy, hydroxyalkyl, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, hydroxy ($C_1$–$C_{10}$) alkyl, ($C_1$–$C_{10}$) alkylOCOCH$_2$COCH$_3$, or $R_7$ and $R_8$ combine to form a cyclic group, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n is independently 0–2, A is an electronwithdrawing group, Y is a conjugated moiety e.g. N=N, CW=CW, CW=N, or N=CW, where W is H, ($C_1$–$C_{10}$) alkyl or ($C_1$–$C_{10}$) alkoxy, x>0, and y≧0, and B is selected from a 5–10 membered aromatic group, polyaromatic group or a heterocyclic aromatic group; and, b) a suitable solvent.

2. A coating composition according to claim 1, where the polymer h as a structure

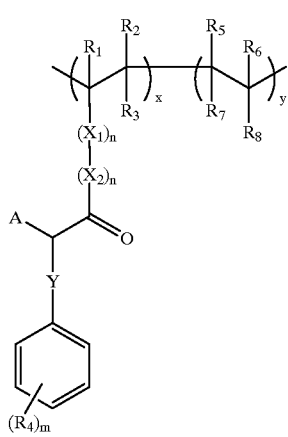

where,
- $R_1$–$R_3$ are independently H, ($C_1$–$C_{10}$) alkyl or ($C_1$–$C_{10}$) alkoxy,
- $R_5$–$R_8$ do not have a crosslinking group and are independently H, ($C_1$–$C_{10}$) alkyl, ($C_1$–$C_{10}$) alkoxy, hyroxyalkyl, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, hydroxy ($C_1$–$C_{10}$) alkyl, ($C_1$–$C_{10}$) alkylOCOCH$_2$COCH$_3$, or $R_7$ and $R_8$ combine to form a cyclic group,
- $X_1$ is C=O, OCO, CONH, O, aryl, ($C_1$–$C_{10}$) alkyl, cyclohexyl, pyridine or pyrollidone,
- $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$),
- n is independently 0–2,
- A is an electronwithdrawing group,
- $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl,
- Y is a conjugated moiety N=N, CW=CW, CW=N, or N=CW, where W is H, ($C_1$–$C_{10}$) alkyl or ($C_1$–$C_{10}$) alkoxy,
- m=1–5, x>0, and y≧0.

3. The coating composition according to claim 1, wherein the polymer has a structure,

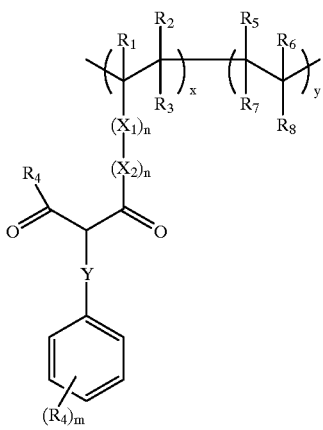

where,
- $R_1$–$R_3$ are independently H, ($C_1$–$C_{10}$) alkyl or ($C_1$–$C_{10}$) alkoxy,
- $R_5$–$R_8$ do not have a crosslinking group and are independently H, ($C_1$–$C_{10}$) alkyl, ($C_1$–$C_{10}$) alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, hydroxy ($C_1$–$C_{10}$) alkyl, ($C_1$–$C_{10}$) alkylOCOCH$_2$COCH$_3$, or $R_7$ and $R_8$ combine to form a cyclic group,
- $X_1$ is C=O, OCO, CONH, O, aryl, ($C_1$–$C_{10}$) alkyl, cyclohexyl, pyridine or pyrollidone,
- $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$),
- n is independently 0–2,
- $R_4$ is H, ($C_1$–$C_{10}$) alkyl, ($C_1$–$C_{10}$) alkoxy, nitro, halide, cyano, aryl, alkylaryl, alkenyl, dicyanovinyl, $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl,
- Y is a conjugated moiety N=N, CW=CW, CW=N, or N=CW, where W is H, ($C_1$–$C_{10}$) alkyl or ($C_1$–$C_{10}$) alkoxy,
- m=1–5, x>0, and y≧0.

4. The coating composition according to claim 1, wherein the solvent comprises a mixture of organic solvents.

5. The coating composition according to claim 1, wherein the solvent is selected from a group consisting of propylene glycol monomethyl ether, propylene glycol monomethyl etheracetate, ethyl lactate, heptanone, cyclopentanone, cyclohexanone, gamma butyrolactone and, water.

6. The coating composition according to claim 1, wherein Y is N=N.

7. The coating composition of claim 1, wherein y=0.

8. The coating composition according to claim 1, wherein the polymer further comprises one or more vinyl monomers that are nonabsorbing and noncrosslinking.

9. The coating composition according to claim 1, wherein $R_8$ is selected from hydroxyl, alkyl hydroxyl, carboxylic acid or its esters, sulfonic acid or its esters, phenolics, ethers, acrylamides and N-(3-Hydroxyphenylmethacrylamide).

10. The coating composition according to claim 1, wherein $R_8$ and $R_7$ are combined to form anhydride, pyridine, maleimde, or pyrollidone.

11. The coating composition according to claim 1, wherein the polymer further comprises at least one unit derived from a hydrophilic vinyl monomer or a vinyl monomer capable of becoming hydrophilic.

12. The coating composition according to claim 11, wherein the hydrophilic group is selected from a group consisting of O(CH$_2$)$_2$—O—(CH$_2$)—OH, O(CH$_2$)$_2$—OH, (CH$_2$)$_n$—OH (where n=1–4), COO(C$_1$–C$_4$)alkyl, COOX, and SO$_3$X (where X is H, alkali metal, ammonium, alkyl ammonium).

13. The coating composition according to claim 1, further comprising a dye.

14. The coating composition according to claim 1, further comprising a crosslinking agent.

15. The coating composition according to claim 14, further comprising an acid.

16. The coating composition according to claim 14, further comprising an acid generator.

17. The coating composition according to claim 16, wherein the acid generator is a thermally activated acid generator.

18. The coating composition according to claim 1, wherein the polymer has a weight average molecular weight in the range of about 500 to about 1,000,000.

19. The coating composition according to claim 1, wherein the metal ion level is less than 50 ppb each metal ion.

20. The process of forming an image on a substrate comprising the steps of:
   a) providing a coating of the coating composition of claim 1 on the substrate;
   b) heating the said coating composition;
   c) providing a coating of a photosensitive material;
   d) imagewise exposing the photosensitive material;
   e) developing the imagewise exposed photosensitive material with an aqueous alkaline developer; and
   f) dry etching the coating composition.

21. The process of claim 20, wherein the photoresist material comprises a novolak resin, a photosensitive compound and a solvent.

22. The process of claim 20, wherein the photoresist material comprises a substituted polyhydroxystyrene, a photoactive compound and a solvent.

23. The process of claim 20, wherein the photoresist material comprises polyhydroxystyrene, a photoactive compound, a dissolution inhibitor and a solvent.

24. The process of claim 20, wherein the heating temperature for the antireflective coating ranges from about 70° C. to about 250° C.

25. The process of claim 20, wherein the film thickness of the coating composition ranges from 0.1 micron to 10 microns.

26. The process of claim 20, wherein the developer is an aqueous solution of metal ion free alkaline hydroxide.

27. The process of claim 20, wherein the photosensitive material is capable of being silylated.

28. The process of claim 20, where after developing and prior to dry etching, reacting the photosensitive material with a silylating material.

* * * * *